US009828575B2

(12) United States Patent
Heo et al.

(10) Patent No.: US 9,828,575 B2
(45) Date of Patent: Nov. 28, 2017

(54) CLEANER COMPOSITION

(71) Applicant: ENF Technology Co., Ltd., Seoul (KR)

(72) Inventors: Jun Heo, Asan-si (KR); Hyuncheol Jeong, Asan-si (KR)

(73) Assignee: ENF Technology Co., Ltd., Seoul (KR)

( * ) Notice: Subject to any disclaimer, the term of this patent is extended or adjusted under 35 U.S.C. 154(b) by 43 days.

(21) Appl. No.: 15/187,913

(22) Filed: Jun. 21, 2016

(65) Prior Publication Data
US 2016/0376532 A1 Dec. 29, 2016

(30) Foreign Application Priority Data

Jun. 23, 2015 (KR) .................. 10-2015-0089246

(51) Int. Cl.
| | |
|---|---|
| *C11D 7/32* | (2006.01) |
| *C11D 11/00* | (2006.01) |
| *H01L 21/02* | (2006.01) |
| *C11D 3/28* | (2006.01) |
| *C11D 3/32* | (2006.01) |

(52) U.S. Cl.
CPC ............ *C11D 11/0047* (2013.01); *C11D 3/28* (2013.01); *C11D 3/32* (2013.01); *C11D 7/3209* (2013.01); *C11D 7/3281* (2013.01); *H01L 21/02074* (2013.01)

(58) Field of Classification Search
CPC .......................... C11D 11/0047; C11D 7/3209
See application file for complete search history.

(56) References Cited

U.S. PATENT DOCUMENTS 4,169,772 A * 10/1979 Lowery .................. C25D 3/22
205/312

FOREIGN PATENT DOCUMENTS

KR 1020030025238 3/2003

* cited by examiner

*Primary Examiner* — Gregory E Webb
(74) *Attorney, Agent, or Firm* — Christensen, Fonder, Dardi & Herbert PLLC; Peter S. Dardi

(57) ABSTRACT

The present invention relates to a cleaner composition. Specifically, the present invention relates to a cleaner composition that can be used to remove metal oxides and metal abrasive particles arising during metal polishing, such as chemical mechanical planarization (CMP). The cleaner composition has an improved ability to complex with metal abrasive particles. In addition, the cleaner composition maintains its ability to reduce metal abrasive particles, achieving improved stability. Therefore, the cleaner composition can be used for cleaning the surface of a metal with an increased ability to prevent corrosion of the metal surface.

10 Claims, 1 Drawing Sheet

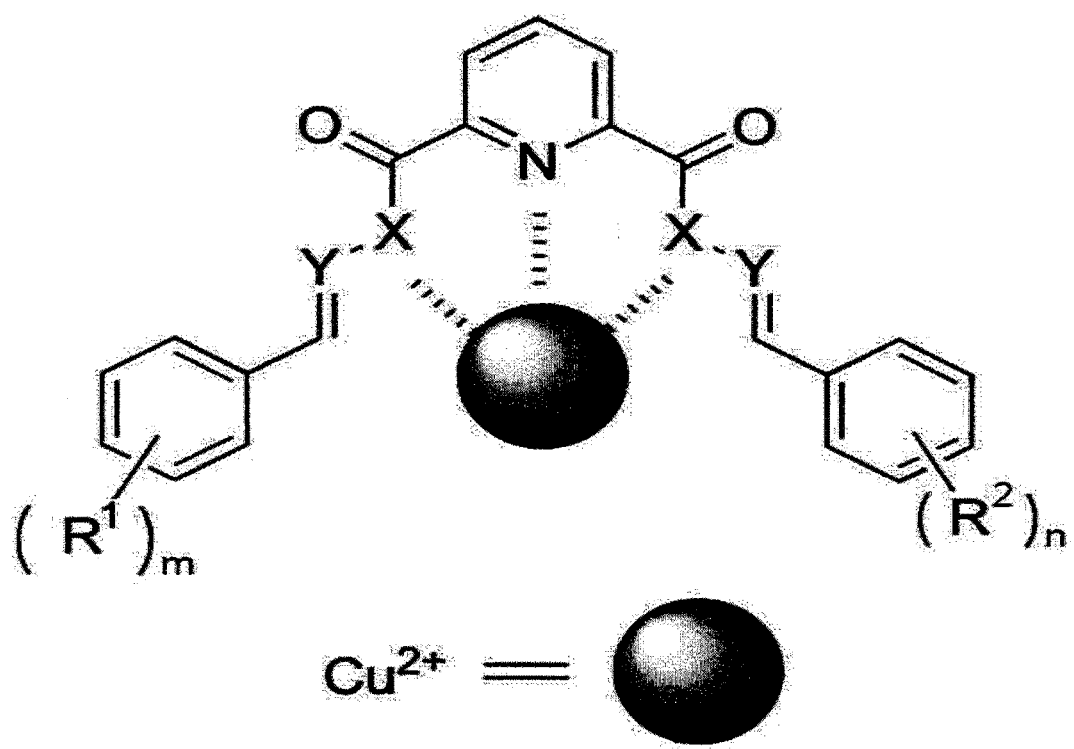

CLEANER COMPOSITION

CROSS REFERENCE TO RELATED APPLICATION

This application claims priority to Korean Patent Application Number 10-2015-0089246, filed Jun. 23, 2015, which is hereby incorporated by reference.

BACKGROUND OF THE INVENTION

1. Field of the Invention

The present invention relates to a cleaner, and more specifically to a cleaner that is used to remove residues after chemical mechanical polishing for planarizing a substrate during semiconductor manufacturing.

2. Description of the Related Art

Semiconductor devices are fabricated through complex multiple processes. Chemical mechanical planarization (CMP) is a semiconductor manufacturing process for planarizing various substrates currently used for the fabrication of semiconductor devices with design geometries of less than 0.35 microns.

CMP involves holding and rotating a thin flat substrate of a semiconductor material against a wetted polishing surface under suitable pressure and temperature conditions. A chemical slurry containing alumina or silica particles can be used as an abrasive. The chemical slurry contains selected chemicals, which etch various substrate surfaces during processing. In this polishing process, the combination of mechanical removal and chemical removal of material is suitable to achieve good surface planarization.

However, CMP may leave contaminants on the surface of the semiconductor substrate. Most of the contaminants are abrasive particles composed of alumina or silica and reactive chemicals added to the polishing slurry. The contaminant layer may include reaction products of the polishing slurry and the polished surface. It is thus necessary to remove the contamination sources before subsequent processing of the semiconductor substrate in order to avoid the introduction of defects causing deterioration in semiconductor device reliability and low fabrication process yield. Under such circumstances, post-CMP cleaning solutions have developed to clean substrate surfaces on which CMP residues are present.

Alkaline solutions based on ammonium hydroxide have been usually used as post-CMP cleaners and most of them are used to clean surfaces containing aluminum, tungsten, tantalum, and oxides.

Copper is currently replacing aluminum as an optimal substance for the production of interconnects. Following CMP of a copper-containing substrate, copper, copper oxides, and slurry particles from the polishing solution may exist on the copper surface. The copper surface can diffuse rapidly in silicon and silicon dioxide. Accordingly, it should be removed from all wafer surfaces to prevent device failure.

However, a typical post-CMP cleaning solution effective in alumina- and silica-based CMP is not effective in cleaning copper-containing surfaces. The cleaning solution is liable to damage copper. Further, the cleaning efficiency of the post-CMP cleaning solution has proven unacceptable.

Korean Patent Publication No. 10-2003-0025238 discloses a cleaning solution for copper post-CMP including a quaternary ammonium hydroxide, a $C_2$-$C_5$ polar organic amine, a corrosion inhibitor, and water wherein the cleaning solution has an alkalinity exceeding 0.073 milliequivalents base per gram of solution. However, the cleaner has a low etch selectivity for copper/copper oxide films, resulting in low cleaning ability.

Thus, there is a need for a cleaner that protects a pure metal, such as copper metal, used in a semiconductor device and effectively removes oxide films on the surface of the metal.

SUMMARY OF THE INVENTION

It is, therefore, an object of the present invention to provide a cleaner composition that protects a pure metal and can effectively remove oxide films on the surface of the metal.

An aspect of the present invention provides a cleaner composition including a compound represented by Formula 1:

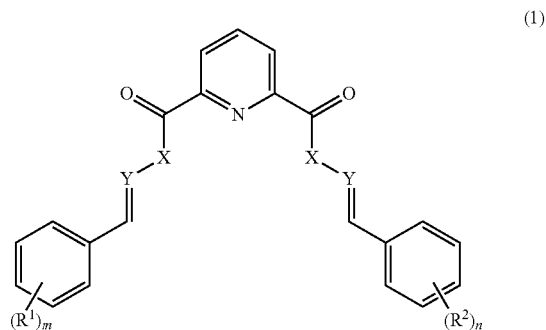

wherein X and Y are each independently an atom or functional group having an unshared pair of electrons, $R^1$ and $R^2$ are each independently a hydrogen atom, a hydroxyl group, a carboxyl group or a substituted or unsubstituted $C_1$-$C_{20}$ alkyl group, and m and n are each independently an integer from 1 to 5.

According to one embodiment, X and Y in Formula 1 may be each independently an atom in the oxygen family, an atom in the nitrogen family or a functional group containing an atom in the oxygen or nitrogen family.

According to one embodiment, X may be an oxygen atom or —NH and Y may be a nitrogen atom.

According to one embodiment, X may be —NH, Y may be nitrogen, and $R^1$ and $R^2$ may be each independently a hydrogen atom, a hydroxyl group or a carboxyl group.

According to one embodiment, the cleaner composition may further include a quaternary ammonium hydroxide.

The quaternary ammonium hydroxide may be selected from tetramethylammonium hydroxide, tetraethylammonium hydroxide, trimethyl(hydroxyethyl)ammonium hydroxide, triethyl(hydroxyethyl)ammonium hydroxide, and mixtures thereof.

According to one embodiment, the cleaner composition may further include an organic amine.

The organic amine may be selected from monoethanolamine, diethanolamine, triethanolamine, imidazolidine ethanol, monoisopropanolamine, aminoisopropanol, aminopropanol, methylaminoethanol, aminobutanol, aminoethoxyethanol, aminoethylaminoethanol, benzylpiperazine, tetrahydrofurfurylamine, diethylenetriamine, triethylenetetramine, tetraethylenepentamine, and mixtures thereof.

According to one embodiment, the cleaner composition may include 1 to 30 parts by weight of the compound of Formula 1, 0.1 to 30 parts by weight of the quaternary ammonium hydroxide, and 1 to 50 parts by weight of the organic amine.

The cleaner composition may be used for cleaning after chemical mechanical polishing (CMP).

The cleaner composition of the present invention has an improved ability to remove residues, such as metal oxides and metal abrasive particles, by cleaning because the compound of Formula 1 is highly complexed with the metal particles. In addition, since the compound of Formula 1 suppresses additional oxidation of the surface of a metal, the cleaner composition of the present invention has an improved ability to prevent corrosion of the metal.

BRIEF DESCRIPTION OF THE DRAWINGS

FIG. 1 is a conceptual diagram showing the principle of action of a compound of Formula 1 included in a cleaner composition of the present invention.

DETAILED DESCRIPTION OF THE INVENTION

The present invention will now be described in detail. It should be understood that the terms and words used in the specification and claims are not to be construed as having common and dictionary meanings, but are construed as having meanings and concepts corresponding to the spirit of the invention in view of the principle that the inventor can define properly the concept of the terms and words in order to describe his/her invention with the best method.

Hereinafter, a more detailed description will be given of embodiments of the present invention.

Processes for fabricating semiconductor devices and microelectronic materials involve chemical mechanical planarization (CMP). After such polishing, natural oxide films may be formed on the surface of metals. Another problem of the polishing is that slurry particles used during processing and contamination residues as well as the metal oxide films may remain on the metal surface. The present invention has been made in view of the above problems and provides a cleaner composition that removes metal oxide films and residues while minimizing damage to a non-oxidized pure metal film.

Specifically, the present invention provides a cleaner composition including a compound represented by Formula 1:

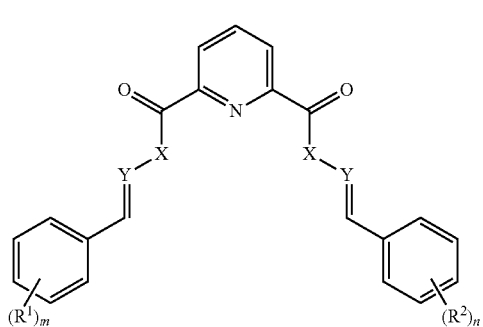

(1)

wherein X and Y are each independently an atom or functional group having an unshared pair of electrons, $R^1$ and $R^2$ are each independently a hydrogen atom, a hydroxyl group, a carboxyl group or a substituted or unsubstituted $C_1$-$C_{20}$ alkyl group, and m and n are each independently an integer from 1 to 5.

The compound of Formula 1 has the ability to complex with and reduce metal or metal oxide particles. The compound of Formula 1 is itself oxidized but can form complexes with and reduce metal or metal oxide particles. The compound of Formula 1 may include functional groups having different functions in the molecular structure.

In Formula 1, X and Y may be each independently selected from atoms and functional groups having unshared pairs of electrons.

As shown in FIG. 1, the compound of Formula 1 can form complexes with metal or metal oxide particles due to the presence of unshared pairs of electrons in X and Y.

The atom or functional group having an unshared pair of electrons may be an atom in the oxygen family, an atom in the nitrogen family or a functional group containing an atom in the oxygen or nitrogen family. The atom in the oxygen family may be, for example, oxygen, sulfur, selenium, tellurium, polonium or livermorium and the atom in the nitrogen family may be, for example, nitrogen, phosphorus, arsenic, antimony or bismuth.

According to one embodiment, X and Y in Formula 1 may be each independently an atom in the oxygen family, an atom in the nitrogen family or a functional group containing an atom in the oxygen or nitrogen family. Preferably, X is an oxygen atom or —NH and Y is a nitrogen atom.

In Formula 1, $R^1$ and $R^2$ may be each independently selected from hydrogen, a hydroxyl group, $C_1$-$C_{10}$ carboxyl groups, and substituted or unsubstituted $C_1$-$C_{20}$ alkyl groups. The term "substituted" used herein means that at least one hydrogen atom included in the compound is replaced by a substituent selected from the group consisting of halogen atoms, $C_1$-$C_{10}$ alkyl groups, halogenated alkyl groups, $C_3$-$C_{30}$ cycloalkyl groups, $C_6$-$C_{30}$ aryl groups, a hydroxyl group, $C_1$-$C_{10}$ alkoxy groups, a carboxylic acid group, an aldehyde group, an epoxy group, a cyano group, a nitro group, an amino group, a sulfonic acid group, and derivatives thereof. Unless otherwise mentioned, the term "alkyl group" is intended to include linear, branched, and cyclic hydrocarbon groups.

The $C_1$-$C_{20}$ alkyl groups may be, for example, methyl, ethyl, n-propyl, isopropyl, n-butyl, isobutyl, pentyl, hexyl, heptyl, octyl, 2-ethylhexyl, nonyl, decyl, undecyl, and dodecyl groups. As the number of carbon atoms increases, the viscosity and boiling point of the desired compound may increase. Meanwhile, the volatility of the compound may increase with decreasing number of carbon atoms. For these reasons, the alkyl groups may be $C_1$-$C_{10}$ or $C_1$-$C_6$ alkyl groups.

According to one embodiment, $R^1$ and $R^2$ in Formula 1 may be each independently a hydrogen atom, a hydroxyl group or a carboxyl group.

According to one embodiment, m and n in Formula 1 represent the numbers of the substituents bonded to the respective benzene rings and may be each independently an integer from 1 to 5 or an integer from 1 to 3.

The content of the compound of Formula 1 may be in the range of 1 to 30 parts by weight, based on 100 parts by weight of the cleaner composition. For example, the compound of Formula 1 may be used in an amount of 1 to 20 parts by weight or 1 to 10 parts by weight. Outside this range, desired effects of the compound on the complexation with and additional oxidation of a metal may not be obtained or the dispersibility of the cleaner composition in the form of a slurry may be adversely affected.

According to one embodiment, the compound of Formula 1 may be prepared by reacting a compound of Formula 2:

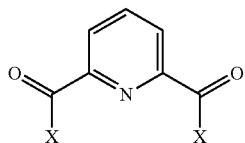
(2)

wherein X is as defined in Formula 1, with a compound of Formula 3:

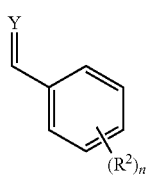
(3)

wherein Y, $R^2$ and n are as defined in Formula 1.

According to one embodiment, examples of compounds that can be represented by Formula 2 include pyridine-2,6-dicarboxylic acid and pyridine-2,6-dicarboxamide.

As compounds that can be represented by Formula 3, there may be mentioned, for example, 4-(iminomethyl)benzoic acid and 4-(iminomethyl)hydroxybenzene.

In the compound of Formula 1, the moiety corresponding to Formula 2 can serve to form complexes with metal oxides to remove oxidized metal and contamination residues, such as metal abrasive particles. The moieties corresponding to Formula 3 can function to protect the surface of a metal from oxygen and alkaline environments to suppress additional oxidation of the metal surface. This function ensures high reducing power of the compound of Formula 1 prepared from the compounds of Formulae 2 and 3. That is, the compound of Formula 1 is itself oxidized but tends to form complexes with and reduce metal oxides.

Based on the characteristics of the compound of Formula 1 in the cleaner composition, the compound can play a role as a complexing agent having the function to complex with a target metal. In addition, the compound of Formula 1 can serve to remove residues and suppress additional oxidation of the surface of a pure metal.

The cleaner composition of the present invention may further include a compound that is understood as a complexing agent, a chelating agent and/or a sequestering agent by those skilled in the art. These additional components can chemically bind to or be physically fixed to target metal atoms and metal ions.

According to one embodiment, the cleaner composition of the present invention may further include a quaternary ammonium hydroxide.

The quaternary ammonium hydroxide has a structure in which hydrocarbon groups are bonded to the quaternary nitrogen atom and may include a salt consisting of a hydroxyl anion and a quaternary nitrogen cation. Examples of the hydrocarbon groups bonded to the quaternary nitrogen atom include alkyl groups, alkenyl groups, aryl groups, aralkyl groups, and hydrocarbon groups in which alkyl, alkenyl, aryl, and aralkyl groups are partially substituted with hydroxyl groups. Specifically, the quaternary ammonium hydroxide may be selected from the group consisting of tetramethylammonium hydroxide (TMAH), tetraethylammonium hydroxide (TEAR), tetrabutylammonium hydroxide (TBAH), tetrapropylammonium hydroxide, trimethylethylammonium hydroxide, (hydroxyethyl)trimethylammonium hydroxide, (hydroxyethyl)triethylammonium hydroxide, (hydroxyethyl)tripropylammonium hydroxide, (hydroxypropyl)trimethylammonium hydroxide, ethyltrimethylammonium hydroxide, diethyldimethylammonium hydroxide, benzyltrimethylammonium hydroxide, and mixtures thereof.

For example, the quaternary ammonium hydroxide may be selected from tetramethylammonium hydroxide, tetraethylammonium hydroxide, trimethyl(hydroxyethyl)ammonium hydroxide, triethyl(hydroxyethyl)ammonium hydroxide, and mixtures thereof.

The content of the quaternary ammonium hydroxide may be in the range of 0.1 to 30 parts by weight, for example, 1 to 20 parts by weight or 1 to 15 parts by weight, based on 100 parts by weight of the cleaner composition. Outside this range, metal oxides may not be easy to remove.

According to one embodiment, the cleaner composition may further include an organic amine. The organic amine acts on metal oxides to uniformly clean the oxidized metal surface. The organic amine may be selected from the group consisting of primary organic amines, second organic amines, and tertiary organic amines.

Specifically, the organic amine may be selected from the group consisting of methylamine, ethylamine, isopropylamine, monopropanolamine, monoisopropylamine, acetylcholine, monoethanolamine, diethanolamine, 2-aminoethanol, 2-(methylamino)ethanol, diglycolamine, methyldiethanolamine, diethylamine, diisopropylamine, dibutylamine, trimethylamine, triethylamine, triisopropylamine, tributylamine, pentamethyldiethylenetriamine, triethanolamine, triethylenediamine, hexamethylenetetramine, 3,3-iminobis, imidazolidine ethanol, dimethylpropylamine, ethylaminoethanol, methylaminoethanol, hydroxyethylmorpholine, aminopropylmorpholine, aminoethoxyethanol, aminopropanol, aminobutanol, iminodiacetic acid, glycine, nitrilotriacetic acid, hydroxyethyliminodiacetic acid, tetramethylguanidine, ethylenediaminetetraacetic acid (EDTA), aminoethylaminoethanol, benzylpiperazine, tetrahydrofurfurylamine, diethylenetriamine, triethylenetetramine, tetraethylenepentamine, and mixtures thereof.

For example, the organic amine may be selected from monoethanolamine, diethanolamine, triethanolamine, 1-imidazolidine ethanol, monoisopropanolamine, 1-aminoisopropanol, 2-amino-1-propanol, N-methylaminoethanol, 3-amino-1-propanol, 4-amino-1-butanol, 2-(2-aminoethoxy)-1-ethanol, 2-(2-aminoethylamino)-1-ethanol, benzylpiperazine, tetrahydrofurfurylamine, diethylenetriamine, triethylenetetramine, tetraethylenepentamine, and mixtures thereof.

The content of the organic amine may be in the range of 1 to 50 parts by weight, for example, 5 to 30 parts by weight, based on 100 parts by weight of the cleaner composition. Outside this range, metal oxide films may not be readily removed, a metal may corrode or the slurry may not be dispersible.

The cleaner composition of the present invention is based on water. The water is typically deionized water for semiconductor processing. For example, the water may have a high purity (≥18 MΩ/cm) and may be added in such an amount that the sum of the amounts of all components including the water is a desired amount (e.g., a total of 100 parts by weight) of the composition.

According to one embodiment, the cleaner composition may optionally further include a metal corrosion inhibitor, a surfactant, and an organic solvent.

The metal corrosion inhibitor may be a compound having an amine group and may be selected from the group consisting of amines, azoles, and mixtures thereof. The metal corrosion inhibitor is a compound including at least one nitrogen atom in an aromatic ring in which a hydrogen atom capable of being dissociated into a hydrogen ion in the slurry may be directly bonded to the nitrogen atom.

Examples of suitable metal corrosion inhibitors include 3-methylpyridine, cysteamine, azole compounds, such as 2-butyne-1,4-diol and 3-butyn-1-ol, and thiol compounds.

According to one embodiment, the metal corrosion inhibitor is an azole compound and examples thereof include triazole, benzotriazole, imidazole, tetrazole, thiazole, oxazole, and pyrazole compounds, which may be used independently or as a mixture thereof. For example, the metal corrosion inhibitor may be selected from the group consisting of triazole compounds, benzotriazole compounds, imidazole compounds, and mixtures thereof. These azole compounds may be used independently or as a mixture thereof.

More specifically, examples of the triazole compounds include triazole, 1H-1,2,3-triazole, 1,2,3-triazole-4,5-dicarboxylic acid, 1,2,4-triazole, 1-H-1,2,4-triazole-3-thiol, and 3-aminotriazole. These triazole compounds may be used independently or as a mixture thereof.

Examples of the benzotriazole compounds include benzotriazole, 1-aminobenzotriazole, 1-hydroxy-benzotriazole, 5-methyl-1H-benzotriazole, and benzotriazole-5-carboxylic acid. These benzotriazole compounds may be used independently or as a mixture thereof.

Examples of the imidazole compounds include imidazole, 1-methylimidazole, benzimidazole, 1-methylbenzimidazole, 2-methylbenzimidazole, and 5-methylbenzimidazole. These imidazole compounds may be used independently or as a mixture thereof.

Examples of the tetrazole compounds include 1H-tetrazole, 1H-tetrazole-5-acetic acid, and 5-aminotetrazole. These tetrazole compounds may be used independently or as a mixture thereof.

Examples of the thiazole compounds include benzothiazole, 2-methylbenzothiazole, 2-aminobenzothiazole, 6-aminobenzothiazole, and 2-mercaptobenzothiazole. These thiazole compounds may be used independently or as a mixture thereof.

Examples of the oxazole compounds include isoxazole, benzoxazole, 2-methylbenzoxazole, and 2-mercaptobenzoxazole. These oxazole compounds may be used independently or as a mixture thereof.

Examples of the pyrazole compounds include pyrazole and 4-pyrazolecarboxylic acid. These pyrazole compounds may be used independently or as a mixture thereof.

According to one embodiment, the metal corrosion inhibitor may be selected from pyridine compounds, piperidine compounds, and mixtures thereof. For example, the metal corrosion inhibitor may 3-methylpyridine or cysteamine.

According to one embodiment, the metal corrosion inhibitor may be selected from pyrazole compounds, triazole compounds, benzotriazole compounds, tolyltriazole compounds, aminotriazole compounds, methyltetrazole compounds, imidazole compounds, pyridine compounds, pyridazine compounds, indazole compounds, and mixtures thereof.

According to one embodiment, the metal corrosion inhibitor may include a benzene group or a hydrophobic group, such as a methyl group. In this case, the oxidation of a metal can be effectively prevented.

The metal corrosion inhibitor may be present in an amount of 10 parts by weight or less, for example, 0.001 to 5 parts by weight, based on 100 parts by weight of the cleaner composition. Without the metal corrosion inhibitor, the desired effect of the metal corrosion inhibitor cannot be expected. The presence of the metal corrosion inhibitor in an amount exceeding 10 parts by weight may deteriorate the cleaning effect of the cleaner composition.

According to one embodiment, the cleaner composition may further include a surfactant as an additive. The surfactant improves the wetting property between patterns or via holes on the surface of a target metal, allowing the cleaner composition to evenly act on the metal surface. Another role of the surfactant is to improve the foaming properties of the other additives. The surfactant may be selected from the group consisting of nonionic surfactants, anionic surfactants, cationic surfactants, amphoteric surfactants, and mixtures thereof.

The nonionic surfactant may be used in admixture with other types of surfactants because it does not form ions in an aqueous solution. Examples of suitable nonionic surfactants include ethoxylated linear alcohols, ethoxylated alkyl phenols, fatty acid esters, amine/amide derivatives, alkyl polyglycosides, ethylene oxide-propylene oxide copolymers, polyalcohols, ethoxylated polyalcohols, thiols, and mercaptan derivatives.

Examples of suitable anionic surfactants include sulfuric acid salts, sulfonic acid salts, organic phosphoric acids, sarcosides, alkyl amino acids, and lauryl sarcosinates. Specific examples of suitable anionic surfactants include alkyl sulfates, alkyl ethoxy ether sulfates, dodecyl benzene sulfonates, alkyl benzene sulfonates, α-olefin sulfonates, lignosulfonates, and sulfocarboxylates.

The cationic surfactant can prevent the generation of static electricity and can act as a softening agent due to its ability to adsorb to a negatively charged substrate. The cationic surfactant can play a role as a dispersant, a flotation collector, a hydrophobic agent or a corrosion inhibitor. Examples of suitable amphoteric surfactants include fatty acid amines, quaternary alkyl-ammonium salts, linear diamines, n-dodecyl pyridinium chloride, imidazole compounds, and morpholine compounds.

The amphoteric surfactant exhibits both anionic and cationic dissociation on the same molecule and has an isoelectric point. Examples of suitable amphoteric surfactants include amphocarboxylates, alkyl betaines, amidoalkyl betaines, amidoalkyl sultaines, amphophosphates, phosphobetaines, pyrophosphobetaines, and carboxyalkyl alkyl polyamines.

As the surfactant, there may be used, for example, an acetylene diol, an alkylamine, an alkyl carboxylic acid, a Pluronic polymer or a mixture thereof. Examples of Pluronic polymers include block copolymers of ethylene oxide and propylene oxide.

The surfactant may be any of those commonly used in the art and is not limited to the above-described types.

The surfactant may be added in an amount of 10 parts by weight or less, for example, 0.0005 to 5 parts by weight, based on 100 parts by weight of the cleaner composition. Without the surfactant, no improvement in wetting property can be expected and the foaming properties of the other additives cannot be improved. The addition of the surfactant in an amount exceeding 10 parts by weight may cause solubility problems, leading to precipitation of the surfactant. For example, the nonionic surfactant, the amphoteric surfactant or a mixture thereof may be added in an amount of 0.001 to 2 parts by weight.

The content of each additive may be properly selected according to the purpose of use of the additive. The total amount of the additives is not limited so long as the effects of the present invention are not sacrificed. The additives are preferably used in a total amount of 10 parts by weight or less, based on 100 parts by weight of the cleaner composition.

According to one embodiment, the cleaner composition may further include an organic solvent. Specifically, the organic solvent may be selected from polyols, sulfones, and mixtures thereof. Examples of the polyols include ethylene glycol, propylene glycol, neopenyl glycol, glycerol, diethylene glycol, dipropylene glycol, 1,4-butanediol, 2,3-butylene glycol, 1,3-pentanediol, 1,4-pentanediol, 1,5-pentanediol, and 3-methyl-1,5-pentanediol. Examples of the sulfones include tetramethylene sulfone, dimethyl sulfone, diethyl sulfone, bis(2-hydroxyethyl)sulfone, methyl sulfolane, and ethyl sulfolane. For example, the organic solvent may be selected from tetramethylene sulfone, glycerin, propylene glycol, ethylene glycol, and mixtures thereof.

According to one embodiment, the cleaner composition is applicable to the cleaning of a substrate containing aluminum, copper, titanium, molybdenum, lead, zinc, tin, silver, a mixture thereof or an alloy thereof. Particularly, the cleaner composition can be effectively used to clean a copper-containing substrate after chemical mechanical polishing but is not limited to this use.

According to one embodiment, the cleaner composition of the present invention may be provided in the form of a concentrate that is diluted with an appropriate amount of water before use. Also in this case, the contents of the components in the cleaner composition are selected from the respective ranges as defined above. For example, when the concentrate is diluted two-fold, the amounts of the compound of Formula 1, the quaternary ammonium hydroxide, and the organic amine in the concentrate are at least two times larger than those defined above. The cleaner composition may be diluted 2- to 100-fold, for example, 5- to 50-fold, before use.

Even after the concentrate is diluted for use, the compound of Formula 1, the quaternary ammonium hydroxide, and the organic amine can maintain their weight proportions, that is, they are present in amounts of 1 to 30 parts by weight (preferably 1 to 20 parts by weight), 0.1 to 30 parts by weight (preferably 1 to 20 parts by weight), and 1 to 50 parts by weight (preferably 5 to 30 parts by weight), respectively.

According to a preferred embodiment, the compound of Formula 1, the quaternary ammonium hydroxide, and the organic amine are used in a weight ratio of 1:0.2-2:0.5-5 or 1:0.5-1.5:0.8-3, but are not limited to this ratio.

As the present invention allows for various changes and numerous embodiments, it will be described in detail such that those skilled in the art can easily practice the present invention based on the description. The following examples are provided for illustrative purposes only and are not intended to limit the present invention. It is to be appreciated that all changes, equivalents, and substitutes that do not depart from the spirit and technical scope of the present invention are encompassed in the present invention.

Synthesis Example 1: Synthesis of PDCA-OH

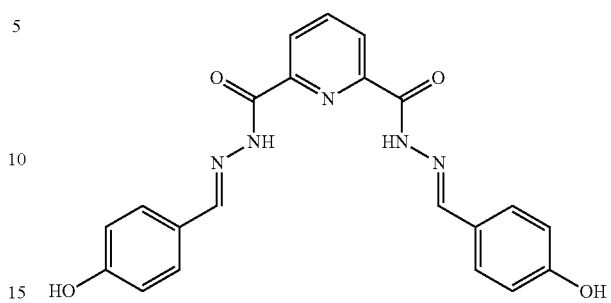

(4)

The compound of Formula 4 was synthesized by the following procedure.

First, 2,6-pyridinedicarboxylic acid was reacted with excess methanol in the presence of thionyl chloride as a catalyst at room temperature for 24 h. After addition of hydrazine hydrate, the reaction was allowed to proceed under reflux for 3 h. Finally, 2 moles of 4-hydroxybenzaldehyde was added and the resulting mixture was refluxed. The product was collected by filtration and purified by recrystallization from hot ethanol.

The NMR data for the final product are as follows:

$^1$H NMR (DMSO-d6, 300 MHz): δ (ppm) 12.44 (s, 2H, —NH), 8.81 (s, 2H, CH═N), 8.37 (m, 2H, CHpy), 8.33 (m, 1H, CHPy), 8.04 (d, 4H, ArH), 7.92 (d, 4H, ArH), 5.35 (2H, Ar—OH), $^{13}$C-NMR (DMSO-d6, 300 MHz): δ (ppm) 160.8 (C1, Ar—OH), 138.18 (C2, ArH), 127.41 (C4, ArH), 132.12 (C5, ArH), 140.11 (C6, —CH═N), 159.70 (C7, —C(O)NH), 148.89-148.15 (C8, C9, Py).

Synthesis Example 2: Synthesis of PDCA-COOH

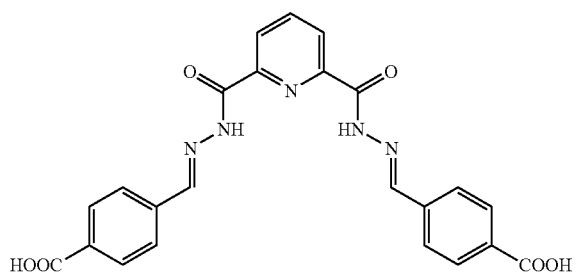

(5)

The compound of Formula 5 was synthesized in the same manner as in Synthesis Example 1, except that 2,6-pyridinedicarboxylic acid, 1 mole of 2,6-dihydrazide, and 2 moles of 4-formylbenzoic acid were allowed to react in methanol. The NMR data for the final product are as follows:

$^1$H NMR (DMSO-d6, 300 MHz): δ (ppm) 13.20 (b, 2H, —COOH), 12.44 (s, 2H, —NH), 8.81 (s, 2H, CH═N), 8.37 (m, 2H, CHpy), 8.33 (m, 1H, CHPy), 8.04 (d, 4H, ArH), 7.92 (d, 4H, ArH).

$^{13}$C-NMR (DMSO-d6, 300 MHz): δ (ppm) 166.95 (C1, —COOH), 138.18 (C2, ArH), 127.41 (C4, ArH), 132.12 (C5, ArH), 140.11 (C6, —CH═N), 159.70 (C7, —C(O)NH), 148.89-148.15 (C8, C9, Py).

Examples 1-5 and Comparative Examples 1-5

As shown in Tables 1 and 2, the components were mixed to prepare cleaner compositions. In the tables, the amounts of the components are given parts by weight. Each composition was made up to 100 parts by weight with water.

The abbreviations in the tables are as follows:
TMAH: Tetramethylammonium hydroxide
TEHA: Tetraethylammonium hydroxide
MEA: Monoethanolamine
DETA: Diethylenetriamine
TETA: Triethylenetetramine
PDCA-OH: Compound of Formula 4
PDCA-CO$_2$H: Compound of Formula 5
EDTA-4NH$_4$: Ethylenediaminetetraacetic acid ammonium salt
CA-3NH$_4$: Citric acid ammonium salt
AsA: Ascorbic acid ammonium salt
DIW: Deionized water

TABLE 1

| | | Example 1 | Example 2 | Example 3 | Example 4 | Example 5 |
|---|---|---|---|---|---|---|
| Quaternary ammonium hydroxides | TMAH | 5.0 | 5.0 | 0 | 5.0 | 5.0 |
| | TEAH | 0 | 0 | 8.1 | 0 | 0 |
| Organic amines | MEA | 9.0 | 9.0 | 9.0 | 0 | 0 |
| | DETA | 0 | 0 | 0 | 15.2 | 0 |
| | TETA | 0 | 0 | 0 | 0 | 21.6 |
| Formula 1 | PDCA-OH | 8.0 | 0 | 0 | 8.0 | 8.0 |
| | PDCA-CO$_2$H | 0 | 9.1 | 9.1 | 0 | 0 |
| Additives | EDTA-4NH$_4$ | 0 | 0 | 0 | 0 | 0 |
| | CA-3NH$_4$ | 0 | 0 | 0 | 0 | 0 |
| | AsA | 0 | 0 | 0 | 0 | 0 |
| DIW | | 78.0 | 76.9 | 73.8 | 71.8 | 65.4 |

TABLE 2

| | | Comparative Example 1 | Comparative Example 2 | Comparative Example 3 | Comparative Example 4 | Comparative Example 5 |
|---|---|---|---|---|---|---|
| Quaternary ammonium hydroxides | TMAH | 5.0 | 5.0 | 5.0 | 5.0 | 5.0 |
| | TEAH | 0 | 0 | 0 | 0 | 0 |
| Organic amines | MEA | 0 | 9.0 | 9.0 | 9.0 | 0 |
| | DETA | 0 | 0 | 0 | 0 | 0 |
| | TETA | 0 | 0 | 0 | 0 | 0 |
| Formula 1 | PDCA-OH | 0 | 0 | 0 | 0 | 0 |
| | PDCA-CO$_2$H | 0 | 0 | 0 | 0 | 0 |
| Additives | EDTA-4NH$_4$ | 0 | 7.2 | 0 | 0 | 7.2 |
| | CA-3NH$_4$ | 0 | 0 | 4.9 | 0 | 0 |
| | AsA | 0 | 0 | 0 | 3.5 | 0 |
| DIW | | 95.0 | 78.8 | 81.1 | 82.5 | 87.8 |

Experimental Example 1: Cleaning of Pure Copper and Copper Oxide

The cleaner compositions of Examples 1-5 and Comparative Examples 1-5 were diluted 50 times before use. Pure copper and copper oxide specimens were immersed in each cleaner composition for 1 min and the dissolution rates of copper and copper oxide were measured by inductively coupled plasma-optical emission spectroscopy (ICP-OES).

The pure copper specimens were copper-containing layers prepared by oxidizing copper in dilute hydrofluoric acid and etching the oxidized copper. The copper oxide specimens were prepared by oxidizing copper in an oven at 200° C. for 30 min. Each specimen was cut to a size of 20 mm×30 mm before experimentation.

Experimental Example 2: Measurement of Oxidation-Reduction Potentials

The stability of each of the cleaner compositions of Examples 1-5 and Comparative Examples 1-5 was investigated by measuring the oxidation-reduction potentials of the cleaner composition using ORP electrodes (Metrohm). The oxidation-reduction potentials were measured immediately after preparation and after standing in air for 48 h.

The etched amounts of copper oxide and pure copper measured in Experimental Example 1 and the oxidation-reduction potentials measured in Experimental Example 2 are shown in Table 3.

TABLE 3

| | Etched amounts | | Selectivity Copper oxide/pure copper | Oxidation-reduction potentials (mV) | |
|---|---|---|---|---|---|
| | Copper oxide | Pure copper | oxide | Initial | After 48 h |
| Example 1 | 54.68 | 17.26 | 3.17 | −335 | −332 |
| Example 2 | 56.87 | 18.25 | 3.12 | −312 | −302 |
| Example 3 | 51.21 | 18.25 | 2.81 | −324 | −311 |
| Example 4 | 62.52 | 19.2 | 3.26 | −354 | −365 |
| Example 5 | 65.5 | 18.9 | 3.47 | −365 | −359 |
| Comparative Example 1 | 145 | 165 | 0.88 | 30.6 | 28.4 |
| Comparative Example 2 | 67.5 | 35.2 | 1.92 | −35.4 | −54.8 |
| Comparative Example 3 | 58.2 | 45.5 | 1.28 | −78.7 | −87.5 |
| Comparative Example 4 | 34.06 | 17.86 | 1.91 | −211.7 | −85.5 |
| Comparative Example 5 | 285 | 398 | 0.72 | 61.3 | 62.3 |

As can be seen from the results in Table 3, the compositions of Examples 1-5 showed high etch selectivities (>2) of copper oxide to pure copper (copper oxide/pure copper) whereas the compositions of Comparative Examples 1-5 showed etch selectivities lower than 2.

Particularly, the cleaner compositions of Examples 1-5 showed low oxidation-reduction potentials lower than −100 even after 48 h, indicating their high reducing power, and were not significantly different from their initial oxidation-reduction potentials. In contrast, the cleaner compositions of Comparative Example 1-5 had oxidizing power or showed relatively low reducing power from the beginning. The reducing power dropped to half of their initial values after 48 h.

These results demonstrate that the cleaner compositions of Examples 1-5 form complexes with copper oxide particles and can thus act as cleaning solutions. The cleaner compositions of Examples 1-5 maintained their low reduction potentials, indicating their ability to suppress additional oxidation of pure copper.

In addition, the cleaner compositions of Examples 1-5 are easy to store and can maintain their stable state during cleaning due to the absence of oxygen- and temperature-sensitive compounds, such as ascorbic acid.

The present invention has been described in detail with reference to its certain exemplary embodiments. It will be understood by those skilled in the art that the detailed description is merely presented to describe preferred embodiments and the scope of the invention is not limited to the described embodiments.

What is claimed is:

1. A cleaner composition comprising a compound represented by Formula 1:

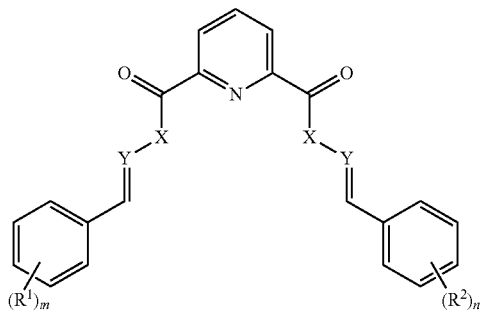

(1)

wherein X and Y are each independently an atom or functional group having an unshared pair of electrons, $R^1$ and $R^2$ are each independently a hydrogen atom, a hydroxyl group, a carboxyl group or a substituted or unsubstituted $C_1$-$C_{20}$ alkyl group, and m and n are each independently an integer from 1 to 5.

2. The cleaner composition according to claim 1, wherein X and Y are each independently an atom in the oxygen family, an atom in the nitrogen family or a functional group containing an atom in the oxygen or nitrogen family.

3. The cleaner composition according to claim 1, wherein X is an oxygen atom or —NH and Y is a nitrogen atom.

4. The cleaner composition according to claim 1, wherein X is —NH, Y is nitrogen, and $R^1$ and $R^2$ are each independently a hydrogen atom, a hydroxyl group or a carboxyl group.

5. The cleaner composition according to claim 1, further comprising a quaternary ammonium hydroxide.

6. The cleaner composition according to claim 5, wherein the quaternary ammonium hydroxide is selected from tetramethylammonium hydroxide, tetraethylammonium hydroxide, trimethyl(hydroxyethyl)ammonium hydroxide, triethyl(hydroxyethyl)ammonium hydroxide, and mixtures thereof.

7. The cleaner composition according to claim 1, further comprising an organic amine.

8. The cleaner composition according to claim 7, wherein the organic amine is selected from monoethanolamine, diethanolamine, triethanolamine, imidazolidine ethanol, monoisopropanolamine, aminoisopropanol, aminopropanol, methylaminoethanol, aminobutanol, aminoethoxyethanol, aminoethylaminoethanol, benzylpiperazine, tetrahydrofurfurylamine, diethylenetriamine, triethylenetetramine, tetraethylenepentamine, and mixtures thereof.

9. The cleaner composition according to claim 1, wherein the cleaner composition comprises 1 to 30 parts by weight of the compound of Formula 1, 0.1 to 30 parts by weight of the quaternary ammonium hydroxide, and 1 to 50 parts by weight of the organic amine.

10. The cleaner composition according to claim 1, wherein the cleaner composition is used for cleaning after chemical mechanical polishing (CMP).

* * * * *